United States Patent
Duan et al.

(10) Patent No.: US 10,370,774 B2
(45) Date of Patent: Aug. 6, 2019

(54) CHEMICAL VAPOR DEPOSITION GROWTH OF GRAPHENE

(71) Applicant: THE REGENTS OF THE UNIVERSITY OF CALIFORNIA, Oakland, CA (US)

(72) Inventors: Xiangfeng Duan, Los Angeles, CA (US); Hailong Zhou, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 588 days.

(21) Appl. No.: 14/759,134

(22) PCT Filed: Jan. 8, 2014

(86) PCT No.: PCT/US2014/010733
§ 371 (c)(1),
(2) Date: Jul. 2, 2015

(87) PCT Pub. No.: WO2014/110170
PCT Pub. Date: Jul. 17, 2014

(65) Prior Publication Data
US 2015/0337458 A1    Nov. 26, 2015

Related U.S. Application Data

(60) Provisional application No. 61/750,461, filed on Jan. 9, 2013.

(51) Int. Cl.
C30B 25/02 (2006.01)
C30B 25/18 (2006.01)
(Continued)

(52) U.S. Cl.
CPC .......... *C30B 25/186* (2013.01); *C01B 32/186* (2017.08); *C30B 29/02* (2013.01); *C01B 2204/02* (2013.01); *C01B 2204/32* (2013.01)

(58) Field of Classification Search
CPC .......... C30B 25/02; C30B 25/04; C30B 29/04
See application file for complete search history.

(56) References Cited

U.S. PATENT DOCUMENTS

| | | | |
|---|---|---|---|
| 2012/0088039 A1* | 4/2012 | Yu | B82Y 30/00 427/596 |
| 2012/0269717 A1 | 10/2012 | Radhakrishnan et al. | |
| 2013/0174968 A1* | 7/2013 | Vlassiouk | C01B 31/0453 156/155 |

FOREIGN PATENT DOCUMENTS

| | | | | |
|---|---|---|---|---|
| CN | 102392225 | 3/2012 | | |
| JP | WO 2011027585 A1 * | 3/2011 | | B82Y 30/00 |

OTHER PUBLICATIONS

Liu et al "synthesis of high quality monolayers and bilayer graphene on copper using chemical vapor deposition" Carbon vol. 49 issue 13 Nov. 2011 pp. 4122-4130.*
(Continued)

*Primary Examiner* — Robert M Kunemund
(74) *Attorney, Agent, or Firm* — Foley & Lardner LLP; Cliff Z. Liu

(57) ABSTRACT

A process of growing graphene includes: (1) providing a metal substrate; (2) annealing the metal substrate up to a growth temperature for an annealing time period and in the presence of a non-reducing gas; and (3) introducing a gas mixture to grow graphene over the metal substrate. The gas mixture includes a first gas and a second gas that is a carbon-containing precursor, a molar ratio of the first gas and the second gas is at least 100, and introducing the gas mixture is carried out at a pressure up to 100 mbar.

17 Claims, 13 Drawing Sheets

(51) Int. Cl.
    *C30B 29/02*      (2006.01)
    *C01B 32/186*     (2017.01)

(56) References Cited

OTHER PUBLICATIONS

Gao, et al., "Repeated Growth and Bubbling Transfer of Graphene with Milimetre-Size Single-Crystal Grains using Platinum." Nature Communications, vol. 3, pp. 699-705 (2012).
Li, et al., "Graphene Films with Large Domain Size by a Two-Step Chemical Vapor Deposition Process." Nano Letters, vol. 10, No. 11, pp. 4328-4334 (2010).
Wassei, et al., "Chemical Vapor Deposition of Graphene on Copper from Methane, Ethane and Propane: Evidence for Bilayer Selectivity." Small, vol. 8, No. 9, pp. 1415-1422 (2012).
International Search Report for International Application No. PCT/US2014/010733 dated May 2, 2014.
Wang, H. et al. (2012) "Controllable Synthesis of Submillimeter Single-Crystal Monolayer Graphene Domains on Copper Foils by Suppressing Nucleation," J Am Chem Soc. 134:3627-3630.
Yan, Z. et al. (2012) "Toward the Synthesis of Wafer-Scale Single-Crystal Graphene on Copper Foils," ASC Nano 6(10):9110-9117.
Zhou, H. et al. (2013) "Chemical vapour deposition growth of large single crystals of monolayer and bilayer graphene," Nature Communications 4:2096.

\* cited by examiner

CHEMICAL VAPOR DEPOSITION GROWTH OF GRAPHENE

CROSS-REFERENCE TO RELATED APPLICATION

This application is a National Stage Entry of PCT/US2014/010733, filed Jan. 8, 2014, which claims the benefit of U.S. Provisional Application Ser. No. 61/750,461 filed on Jan. 9, 2013, the disclosure of which is incorporated herein by reference in its entirety.

FIELD OF THE INVENTION

This disclosure generally relates to graphene and, more particularly, to chemical vapor deposition (CVD) growth of graphene.

BACKGROUND

Graphene has emerged as an exciting atomically thin material for fundamental studies and applications in electronics and other applications. Pristine graphene can be obtained through a mechanical exfoliation approach to break the weak van der Waals forces between adjacent layers of graphite. This exfoliation approach can produce high quality graphene, but often with sizes restricted to a few or a few tens of micrometers. On the other hand, a CVD approach can be used to produce graphene with larger sizes, but typically with a polycrystalline structure and a high density of domain or grain boundaries, leading to highly variable electronic properties. Even though a mobility of CVD graphene within a single domain can be comparable to that of exfoliated graphene, the overall transport characteristics of wafer-scale CVD graphene is still largely restricted by crystal defects at domain boundaries. Therefore, achieving large domain, single crystalline graphene represents a challenge for the large-scale fabrication of functional electronic and optoelectronic devices from graphene.

It is against this background that a need arose to develop the CVD process for the growth of graphene described herein.

SUMMARY

One aspect of this disclosure relates to a process of growing graphene. In one embodiment, the process includes: (1) providing a metal substrate; (2) annealing the metal substrate up to a growth temperature for an annealing time period and in the presence of a non-reducing gas; and (3) introducing a gas mixture to grow graphene over the metal substrate. The gas mixture includes a first gas and a second gas that is a carbon-containing precursor, a molar ratio of the first gas and the second gas is at least 100, and introducing the gas mixture is carried out at a pressure up to 100 mbar.

Another aspect of this disclosure relates to a graphene material. In one embodiment, the graphene material includes a monolayer graphene domain, where the graphene domain is single crystalline and has a lateral size of at least 2.4 mm.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

Growth of Graphene

Figure 1:
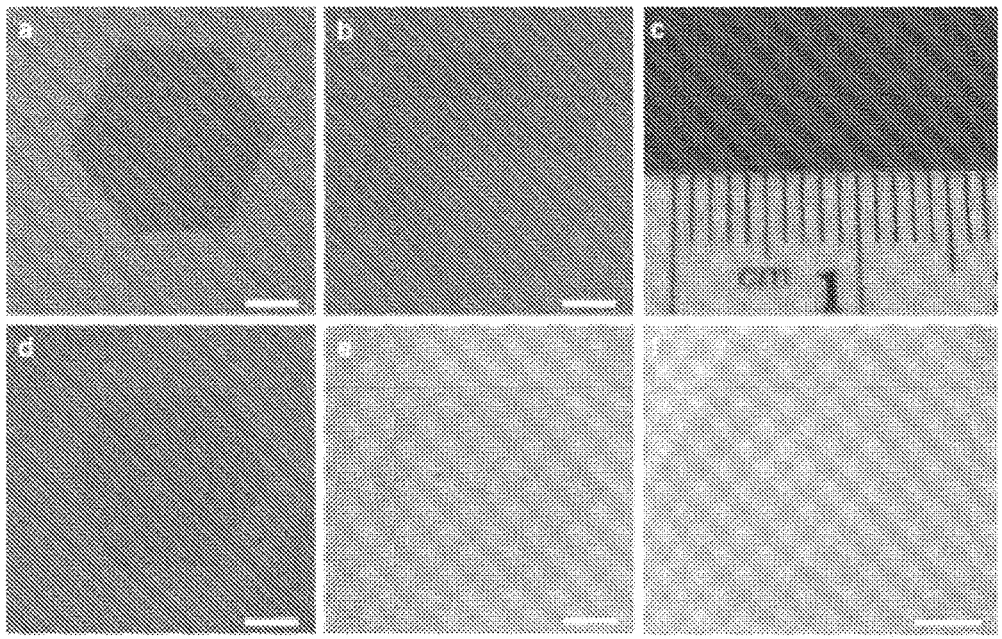
FIG. 1: Giant graphene single crystals obtained at variable growth durations. (a) Scanning electron microscopy (SEM) image and (d) optical microscopy image of a graphene domain obtained with about 6 hours of growth. (b) SEM image and (e) optical microscopy image of a graphene domain obtained with about 24 hours of growth. (c) Photograph and (f) optical microscopy image (f) of graphene domains obtained with about 48 hours of growth. The scale bars are 0.2 mm in a and d, 0.4 mm in b and e, 1 mm in f.

Embodiments of this disclosure are directed to a nucleation-controlled CVD process to regulate graphene domain density on growth substrates to form ultra-large single crystalline graphene domains. The formation of ultra-large single crystalline graphene domains allows for high yield fabrication of integrated graphene devices, paving a pathway to scalable electronic and photonic devices based on graphene materials.

As will be understood, graphene is an allotrope of carbon, and its structure is typically one-atom-thick sheets of $sp^2$-bonded carbon atoms that are packed in a honeycomb crystal lattice. In some embodiments, graphene is provided in the form of thin films of substantially a monolayer of carbon atoms that can be envisioned as unrolled carbon nanotubes, although a bilayer or other multilayer of graphene is also encompassed by this disclosure.

The challenge to achieve large domain single crystalline graphene in a CVD process is to reduce the nucleation density. Here, some embodiments demonstrate that a short anneal of copper foils (or other suitable growth substrates) in substantially pure argon gas (or other suitable non-reducing gas, such other suitable inert gas, oxidizing gas (e.g., oxygen gas), or a mixture of inert and oxidizing gases) prior to the introduction of a carbon-containing precursor can suppress the nucleation of graphene domains. In some embodiments, some residue oxygen gas can be present when using an inert gas or other non-reducing gas. Systematic investigations present an integrated strategy, using low reactor pressure, pre-growth annealing in anon-reducing gas, and high hydrogen/methane molar ratio, to suppress the graphene nucleation density to be as low as about 4-nuclei/$cm^2$ (or even lower) in some embodiments. In some embodiments, the graphene nucleation density can be no greater than about $5×10^5$-nuclei/$cm^2$, no greater than about $1×10^5$-nuclei/$cm^2$, no greater than about $5×10^4$-nuclei/$cm^2$, no greater than about $1×10^4$-nuclei/$cm^2$, no greater than about $5×10^3$-nuclei/$cm^2$, no greater than about $1×10^3$-nuclei/$cm^2$, no greater than about $5×10^2$-nuclei/$cm^2$, no greater than about $1×10^2$-nuclei/$cm^2$, or no greater than about 50-nuclei/$cm^2$, and down to about 4-nuclei/$cm^2$ or less.

Using optimized growth conditions, it is demonstrated that the growth of a single crystalline monolayer graphene domain can be achieved with a lateral size up to about 5 mm (or more), and that the growth of an AB-stacked bilayer graphene domain can be achieved with a lateral size up to about 300 µm (or more) in some embodiments. More generally for some embodiments, a single crystalline monolayer graphene domain can have a lateral size of at least about 0.5 mm, such as at least about 1 mm, at least about 1.5 mm, at least about 2 mm, at least about 2.4 mm, at least about 2.5 mm, at least about 2.6 mm, at least about 2.7 mm, at least about 2.8 mm, at least about 2.9 mm, or at least about 3 mm, and up to about 5 mm or more, such as up to about 4.9 mm, up to about 4.8 mm, or up to about 4.7 mm, and a bilayer graphene domain can have a lateral size of at least about 30 µm, such as at least about 50 µm, at least about 70 µm, at least about 90 µm, at least about 120 µm, or at least about 150 µm, and up to about 300 µm or more, such as up to about 290 µm, up to about 280 µm, or up to about 270 µm, Within a particular grapheme domain, the domain is single crystalline in that the domain is substantially devoid of any domain or grain boundary within edges of the domain, and angles of a graphene lattice extracted from diffraction patterns can show no greater than about 10° rotation of a graphene lattice direction throughout the domain, such as no greater than about 9° rotation, no greater than about 8° rotation, no greater than about 7° rotation, no greater than about 6° rotation, no greater than about 5° rotation, no greater than about 4° rotation, no greater than about 3° rotation, or no greater than about 2° rotation, and down to about 1.2° rotation or less. The ultra-large single crystalline graphene domains can allow for the implementation of high-performance graphene based transistors with excellent uniformity and reproducibility.

In some embodiments, graphene is grown by copper-catalyzed low pressure chemical vapor deposition (LPCVD) using a gas mixture of argon, hydrogen, and diluted methane, where methane gas is a carbon-containing precursor. First, copper foils are washed, rinsed, and dried by nitrogen gas blow. The dried copper foils are loaded into a CVD system, such as a reactor with a horizontal tube furnace and 1-inch quartz tube. The system is pumped down to a vacuum (e.g., about 10 mTorr in about 30 min), re-filled with substantially pure argon gas (e.g., 300 sccm) or an argon/hydrogen mixture, and then heated (e.g., about 1070° C. within about 25 min). Next the diluted methane and hydrogen are introduced into the CVD system for the grapheme growth (e.g., at about 1070° C.) with a selected hydrogen/methane molar ratio (e.g., about 1,320 to about 8,800) under a selected pressure (e.g., about 1-1000 mbar). The growth is terminated by quenching the quartz tube (e.g., cooling rate of about 200° C./min) in ambient environment.

More generally for some embodiments, the graphene growth can carried out on a variety of metal (e.g., platinum, gold, or copper) substrates by using the CVD process, and using a variety of deposition processes using carbon-containing precursors (e.g., plasmonic enhanced CVD, microwave plasma-assisted CVD, atomic layer CVD, combustion CVD, hybrid physical-chemical (ND, and metalorganic CVD). Copper is a desirable material to serve as the growth substrate due to its low cost and a resulting high yield of monolayer graphene. Pre-growth annealing up to a growth temperature can be carried out in a relatively short annealing time period that is less than about 1 hour, such as up to about 55 min, up to about 50 min, up to about 45 min, up to about 40 min, up to about 35 min, up to about 30 min, or up to about 2.5 min, and down to about 10 min or less, such as down to about 12 min, down to about 13 min, or down to about 15 min. Another inert or substantially non-reducing gas can be used in place of, or in combination with, argon, such as another noble gas or nitrogen gas. In some embodiments, a graphene domain density can be reduced by about 50 times (or more) when a copper foil is annealed in a pure argon gas (e.g., about $15/mm^2$) compared to that annealed in an argon/hydrogen mixture (e.g., about $1,000/mm^2$). In such embodiments, argon (or other suitable non-reducing gas, such other suitable inert gas, oxidizing gas, or a mixture of inert and oxidizing gases) can constitute at least about 90% (by mole) of all gases to which the copper foil (or another growth substrate) is exposed during the pre-growth annealing stage, such as at least about 91%, as at least about 93%, as at least about 95%, as at least about 97%, as at least about 98%, as at least about 99%, or as at least about 99.5%, and up to about 99.9%, up to about 99.99%, or more.

Growth temperature can be set from about 800° C. to about 1,300° C. or from about 900° C. to about 1,200° C. (e.g., about 1,100° C. or about 1,070° C.) under a low reactor pressure, and a higher growth temperature within the stated ranges can promote a larger single domain graphene in some embodiments. Therefore, about 1,070° C. can be set as the growth temperature for the fabrication of large single domain graphene in some embodiments. Lower reactor pressures can result in a lower graphene nucleation density, and about 1 mbar can be set as the reactor pressure used in some embodiments. More generally for some embodiments, the reactor pressure can be up to about 1,000 mbar, such as up to about 500 mbar, up to about 100 mbar, up to about 50 mbar, up to about 10 mbar, up to about 5 mbar, up to about 4 mbar, up to about 3 mbar, up to about 2 mbar, or up to about 1 mbar, and down to about 0.1 mbar or less, such as down to about 0.2 mbar, down to about 0.3 mbar, or down to about 0.4 mbar. A molar ratio of hydrogen/methane can be at least about 10, such as at least about 50, at least about 100, at least about 200, at least about 300, at least about 400, at least about 500, at least about 11,000, at least about 1,100, at least about 1,200, or at least about 1,300, and up to about 10,000 or more, such as up to about 9,500, up to about 9,000, or up to about 8,800. Another carbon-containing precursor can be used in place of, or in combination with, methane, such as another C1-C10 alkane or other hydrocarbon, and another activator/etching agent can be used in place of or in combination with, hydrogen. The cooling rate of growth termination can be set from about 1° C./min to about 1,000° C./min under low reactor pressure or atmospheric reactor pressure, such as at least about 1° C./min, at least about 10° C./min, at least about 50° C./min, at least about 100° C./min, at least about 200° C./min, and up to about 1,000° C./min or more.

This disclosure presents a process to grow ultra-large single crystalline domains of monolayer and bilayer graphene. The ultra-large single crystalline domains of graphene can allow excellent device performance with highly uniform electrical characteristics. The process can therefore pave an effective pathway to large scale integration of graphene devices with high yield and high reproducibility, which are desirable for practical applications. Additional embodiments can develop the process for roll-to-roll production of industrial scale graphene film (e.g., 30 inches sized copper foils).

Example

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Chemical Vapor Deposition Growth of Large Single Crystalline Domains of Monolayer and Bilayer Graphene The growth of large domain single crystalline graphene with a controllable number of layers is of importance for large scale integration of graphene devices. By developing a nucleation-controlled CVD process on copper foils, this example demonstrates the growth of the largest reported single crystalline domain of monolayer graphene with a lateral size up to about 5 mm and an area coverage over about 16 $mm^2$, as well as the largest reported domain of AB-stacked bilayer graphene with a lateral size up to about 300 μm. The formation of the single crystalline graphene domains eliminate or reduce the grain boundary scattering and can provide excellent device performance and device-to-device uniformity. Electrical characterizations of over 50 transistors fabricated within a single crystalline domain of monolayer graphene show highly uniform device characteristics with the highest reported carrier mobility exceeding about 8,000 $cm^2/V \cdot s$. The availability of the ultra-large single crystalline graphene domains can allow for high yield fabrication of integrated graphene devices, paving a pathway to scalable electronic and photonic devices based on graphene materials.

The typical size of CVD graphene domains is on the order of 10 μm, which is dictated by a relatively large number of graphene nuclei (about $10^6/cm^2$) at an initial nucleation stage. Therefore, a challenge to achieve large domain single crystalline graphene in a CVD process is to reduce the nucleation density. Surface treatment can be used to control the nucleation density. For example, a long-duration (about 1 hour) anneal of copper foils at atmospheric pressure can be used to reduce the nucleation of the graphene to achieve about 1.3 mm sized graphene domains. An electrochemical polished copper foil followed by a 7 hour pre-annealing operation at high temperature and high pressure also can be used to prepare the copper foil for the growth of single crystalline graphene domains with sizes up to about 2.3 mm. The surface polishing and high temperature annealing are believed to help reduce the impurities and defects on a surface of a substrate, which usually contribute as nucleation centers.

In contrast to surface treatment, this example demonstrates that a short anneal of copper foils in pure argon gas prior to the introduction of carbon-containing species can significantly suppress the nucleation of graphene domains. Without wishing to be bound by a particular theory, it is believed that the oxidation on the copper surface plays a role in the initial nucleation stage. Systematic investigations present an integrated strategy, using low reactor pressure, pre-growth annealing in pure argon, and high hydrogen/methane molar ratio, to significantly suppress the graphene nucleation density by more than 5 orders of magnitude to reach an ultra-low density of about 4-nuclei/cm$^2$. Using optimized growth conditions, this example demonstrates the synthesis of single crystalline monolayer graphene domain with a lateral size up to about 5 mm and the AB stacked bilayer graphene domain with lateral sizes up to about 300 μm, both are the largest reported single crystalline domain sizes. The ultra-large single crystalline domain graphene can allow for the implementation of high-performance graphene based transistors with excellent uniformity and reproducibility.

Scanning electron microscopy (SEM) images (FIGS. 1a and 1b), photograph (FIG. 1c), and optical microscopy images (FIGS. 1d, 1e, and 1f) show the ultra-large single crystalline domains of monolayer graphene obtained with a growth duration of about 6, about 24, and about 48 hours, respectively. The detailed growth parameters are described in the Methods section. The lateral size of the largest single domain graphene can reach up to about 5 mm (FIGS. 1c and 1f). All the graphene domains shown in the SEM and optical microscopy images have a hexagonal shape with straight edges and clear uniform color contrast. Small domains of bilayer or multiple layers graphene are also occasionally seen at the center of an individual graphene film (FIG. 1e).

Figure 2:
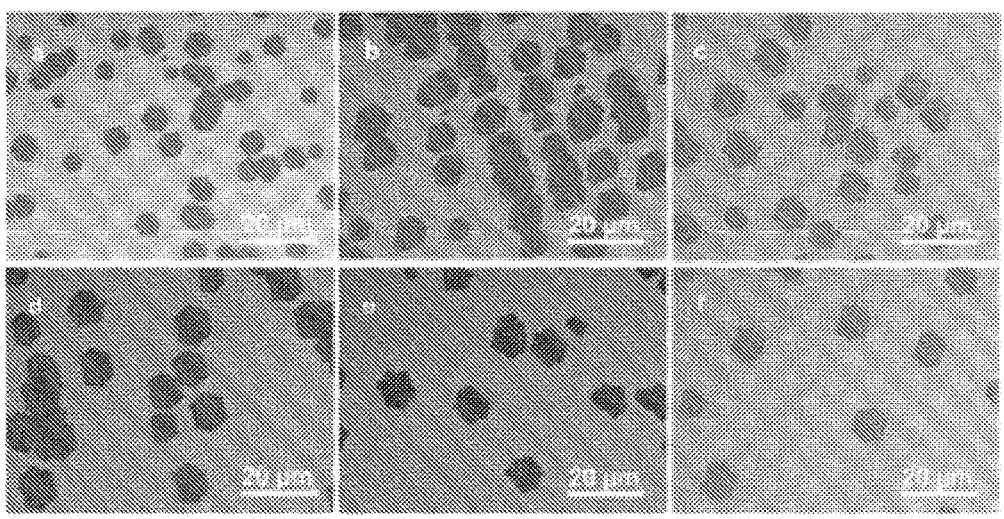
FIG. 2: Reactor pressure dependence of graphene domain density. SEM images of the graphene samples obtained under variable reactor pressure for about 5 min growth, while all the other conditions are kept the same with the growth temperature of about 1,070° C. and $Ar/H_2/CH_4$ (about 500 ppm diluted) flow rate of about 270/30/50 sccm (the molar ratio of $H_2/CH_4$ is about 1,320). The reactor pressures are: (a) about 1,000 mbar; (b) about 750 mbar; (c) about 500 mbar; (d) about 250 mbar; (e) about 100 mbar; and (f) about 1 mbar.
Figure 3:
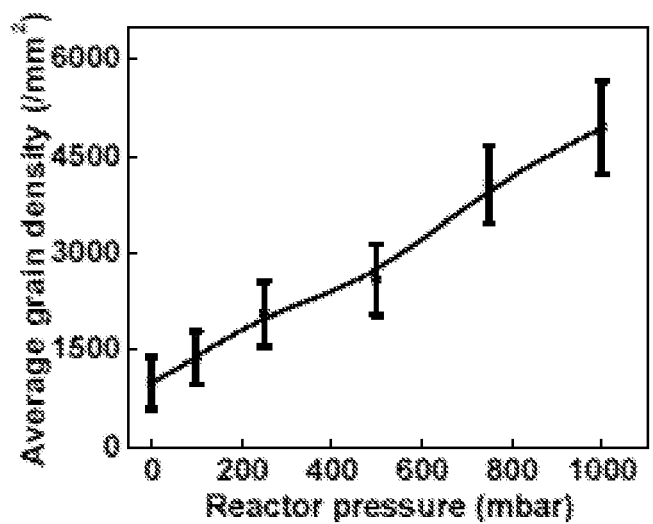
FIG. 3: Average graphene domain density as a function of the reactor pressure. The plot shows that the domain density decreases with decreasing reactor pressure, with an average domain density changed from about $5 \times 10^5$-nuclei/cm$^2$ to about $1 \times 10^5$-nuclei/cm$^2$ as the reactor pressure decreased from about 1,000 mbar to about 1 mbar.
Figure 4:
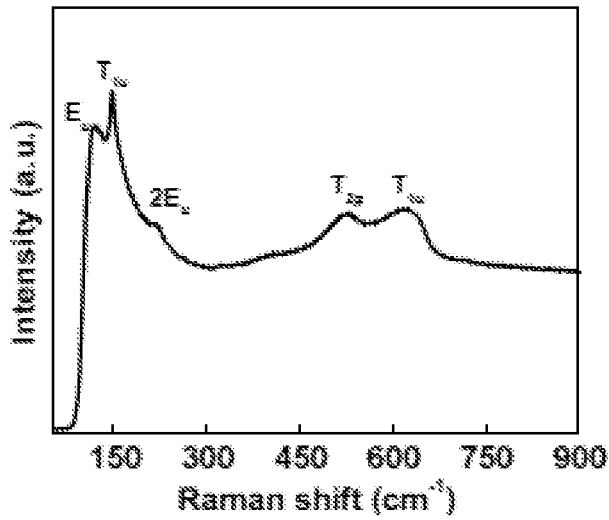
FIG. 4: Raman spectrum of a copper foil surface. The Raman modes observed at 120 cm$^{-1}$ ($E_u$), 150 cm$^{-1}$ ($T_{1u}$), 220 cm$^{-1}$ ($2E_u$), 520 cm$^{-1}$ ($T_{2g}$), and 630 cm$^{-1}$ ($T_{1u}$) are consistent with the experimental spectra of bulk $Cu_2O$ crystals, demonstrating that a $Cu_2O$ layer exists on the surface of copper foils exposed to the air.
Figure 5:
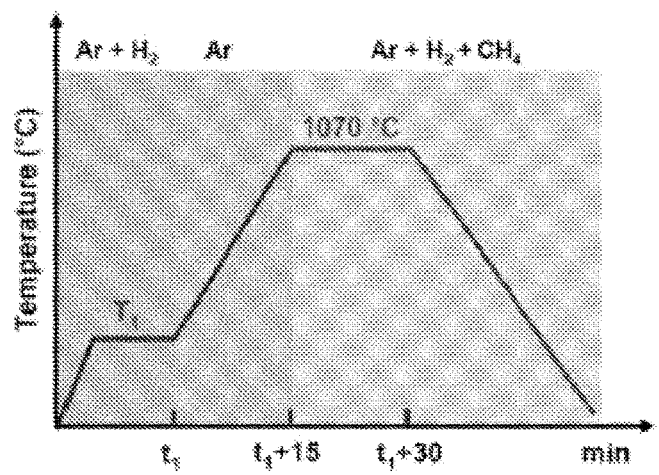
FIG. 5: Growth recipe for a pre-growth annealing study. A systematic study on the nucleation density dependence on different pre-growth annealing temperatures ($T_1$) and duration ($t_1$) in $Ar/H_2$. The plot profile shows growth recipe for the growth processes with variable annealing temperature ($T_1$) (see FIG. 6) for variable duration ($t_1$) (see FIG. 7) in $Ar/H_2$ before ramping up to about 1,070° C. for growth.
Figure 6:
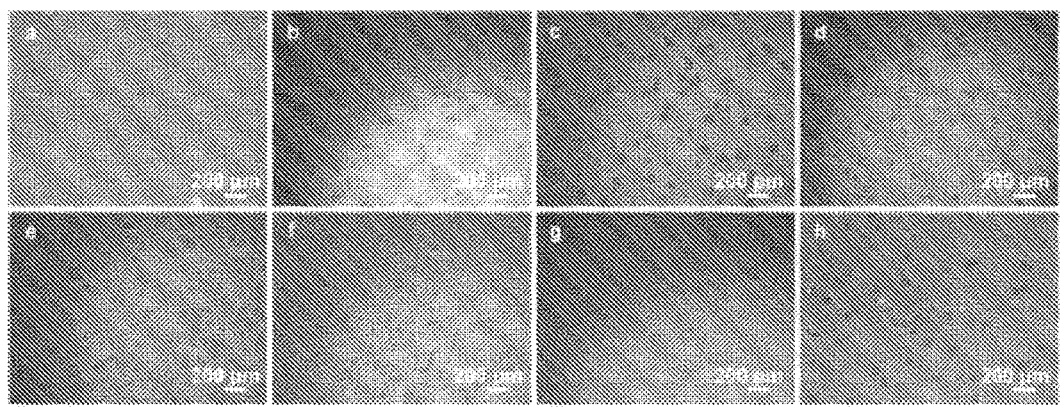
FIG. 6: Annealing experiments with varying annealing temperatures ($T_1$). SEM images of graphene sample grown at about 1,070° C. for about 15 min with different pre-growth annealing temperatures ($T_1$) under mixed $Ar/H_2$ (about 200/100 sccm) flow at about 1 mbar; (a) about 100° C.; (b) about 200° C.; (c) about 400° C.; (d) about 600° C.; (e) about 800° C.; (f) about 1,000° C.; (g) about 1,040° C.; (h) graphene sample growth by annealing at about 1,070° C. under pure Ar (about 300 sccm) annealing. SEM images show that the as-grown graphene nucleation/domain density increases with higher annealing temperature. It is also noted that the graphene nucleation/domain density was reduced by about two orders of magnitude when the copper foils was annealed in the pure argon gas (about $10^3$-nuclei/cm$^2$) (h) compared to those in the argon and hydrogen mixture (about $10^5$-nuclei/cm$^2$) (g). Consistent results were achieved with over 40 repeating runs.

A systematic investigation was conducted on the growth parameters to achieve 5 mm sized single crystalline graphene domains. First, it is demonstrated that the average domain density of the as-grown graphene can be reduced from about 5×10/cm$^2$ to about 1×10$^5$/cm$^2$ when the reactor pressure is decreased from atmospheric pressure to about 1 mbar (FIGS. 2 and 3). Second, it is found that a short duration anneal of the copper foils in pure argon gas (or other suitable non-reducing gas, such other suitable inert gas, oxidizing gas, or a mixture of inert and oxidizing gases) can significantly suppress the nucleation of graphene domains. The oxidation of the copper surface is believed to play a role here. A Cu$_2$O layer usually exists on the copper foils exposed to the ambient environment (FIG. 4). This Cu$_2$O layer can be reduced by a small amount of hydrogen gas (e.g., about 5% H$_2$ in He gas mixture) at relatively lower temperatures (e.g., about 250° C.). The studies show that the domain density can be reduced by nearly two orders of magnitude when the copper foil is annealed in the pure argon gas (or other suitable non-reducing gas, such other suitable inert gas, oxidizing gas, or a mixture of inert and oxidizing gases) (about 10$^3$/cm$^2$) compared with that annealed in the argon/hydrogen mixture (about 10$^5$/cm$^2$) (FIG. 5 and FIG. 6). This effect is repeatedly observed with over 40 similar growth runs. The reduction of the graphene nucleation here can be attributed to higher nucleation barrier on the copper oxide compared to the fresh copper surface.

Figure 7:
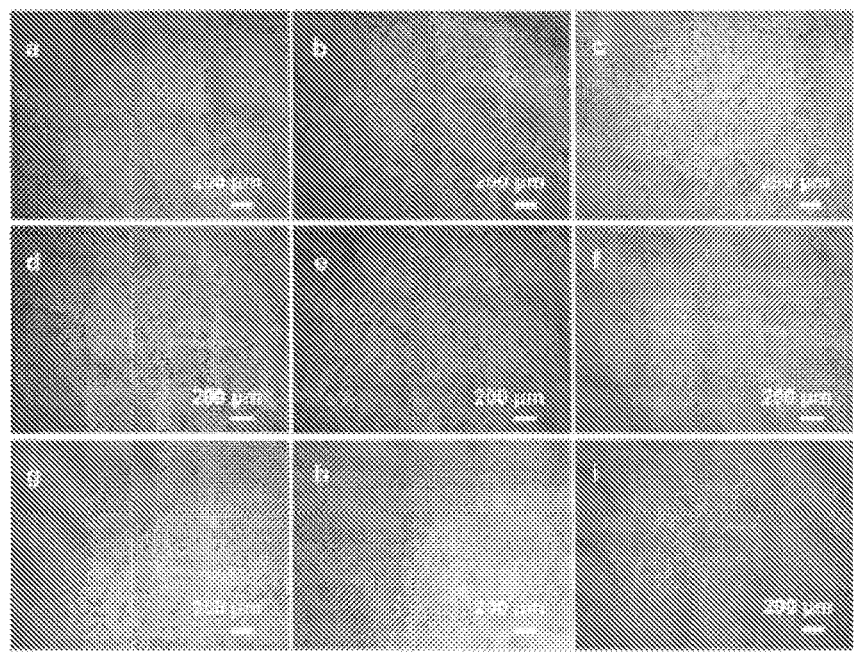
FIG. 7: Annealing experiments with varying annealing temperatures ($T_1$) and times ($t_1$). SEM images of graphene sample grown at about 1,070° C. for about 15 min with different annealing temperatures and various annealing times under mixed $Ar/H_2$ (about 200/100 sccm) flow: (a) about 900° C., about 15 min; (b) about 900° C., about 1.5 h; (c) about 900° C., about 2 h; (d) about 950° C., about 15 min; (e) about 950° C., about 1.5 h; (f) about 950° C., about 2 h; (g) about 1,000° C., about 15 min; (h) about 1,000° C., about 1.5 h; (i) about 1,000° C., about 2 h.

To further confirm the hypothesis, a systematic investigation was conducted of the nucleation density dependence on the pre-growth annealing in Ar/H$_2$ mixture. In this study, a copper foil is first annealed in an Ar/H$_2$ mixture at variable temperatures for different durations before it was ramped up (in Ar or other suitable non-reducing gas) to a growth temperature for graphene growth (FIG. 5), with which the nucleation density was investigated after about 15-min growth process (FIGS. 6 and 7). The hypothesis is that the native oxide on Cu foil can be increasingly reduced back to Cu with increasing annealing temperature or duration in Ar/H$_2$. The reduced Cu is catalytically more active to allow much faster and higher density nucleation of graphene domain. Indeed, the studies demonstrate that graphene domain density increases with the Ar/H$_2$ annealing temperature or duration (FIGS. 6 and 7), which is in stark contrast to long duration hydrogen annealing under high pressure (to reduce defect density and therefore nucleation density). These studies demonstrate that the surface oxide plays a role in suppressing the nucleation of graphene on Cu surface. Once a small amount of hydrogen is introduced into the reactor, the hydrogen gas can quickly reduce the copper oxides to pure copper, due to a relatively low activation energy for the reduction of copper oxide (about 27.4 kcal/mol for Cu$_2$O). Since the graphene tends to nucleate on reduced Cu surfaces instead of the Cu$_2$O surface, the nucleation density of the graphene can be greatly suppressed by annealing under pure argon gas (or other suitable non-reducing gas, such other suitable inert gas, oxidizing gas, or a mixture of inert and oxidizing gases) without pre-reducing Cu$_2$O into Cu. Indeed, the studies demonstrate an approximately two orders of magnitude decrease of the graphene nucleation density using this process.

Figure 8:
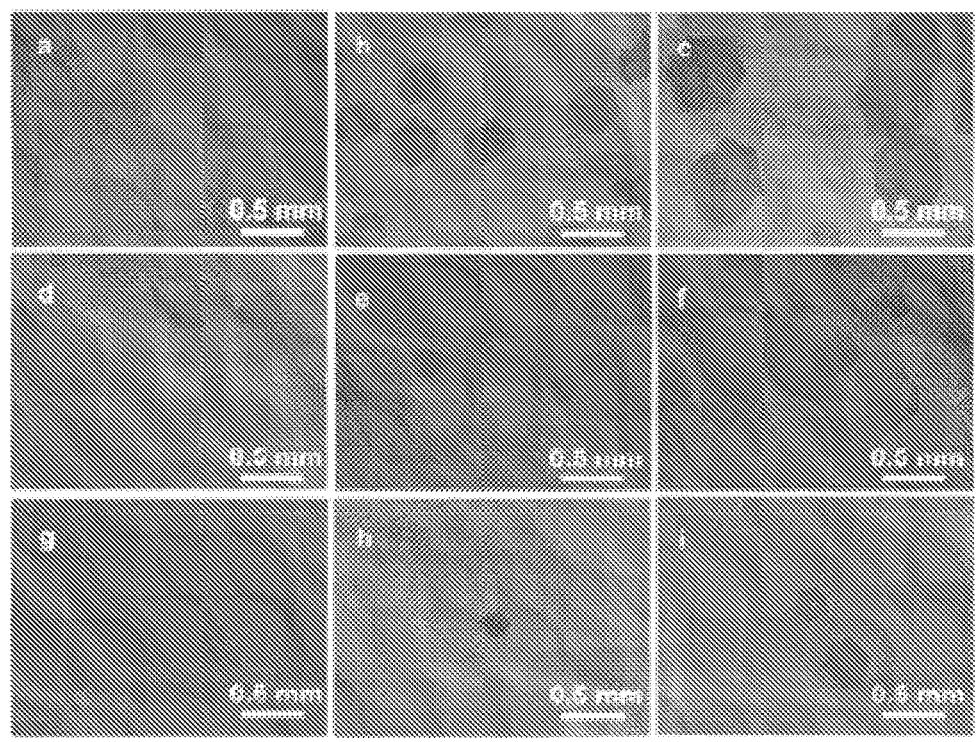
FIG. 8: Dependence of graphene domain density on the molar ratio of $H_2/CH_4$. SEM images of graphene grown on copper substrates annealed by pure Argon at about 1,070° C. in about 1 mbar. All growth was carried out for about 2 hours with different $Ar/H_2/CH_2$ flow rates: (a) about 0/200/150 sccm ($H_2/CH_4$ molar ratio: about 2,933); (b) about 50/150/150 sccm ($H_2/CH_4$ molar ratio: about 2,200); (c) about 100/100/150 sccm ($H_7/CH_4$ molar ratio: about 1,466); (d) about 50/200/100 sccm ($H_2/CH_4$ molar ratio: about 4,400); (e) about 100/150/100 sccm ($H_2/CH_4$ molar ratio: about 3,300); (f) about 150/100/100 sccm ($H_2/CH_4$ molar ratio: about 2,200); (g) about 100/200/50 sccm ($H_2/CF_4$ molar ratio: about 8,800); (h) about 150/150/50 sccm ($H_2/CH_4$ molar ratio: about 6,600); (i) about 200/100/50 sccm ($H_2/CH_4$ molar ratio: about 4,400). The graphene nucleation density can be decreased from about about $10^3$-nuclei/$cm^2$ to as low as about 4-nuclei/$cm^2$ by increasing the molar ratio of $H_2/CH_4$ from about 1,466 to about 8,800. In an about 48 hour growth with the $H_2/CH_4$ molar ratio of about 6,000, the largest graphene monolayer domain can be achieved with the lateral size up to about 5 mm.

The nucleation of graphene on copper foil can be further controlled by the molar ratios between the methane and hydrogen gases. The studies show that a higher hydrogen/methane molar ratio leads to both a reduced nucleation density and a lower growth rate. For a constant growth duration (e.g., about 2 hours), the graphene nucleation density can be decreased from about 10$^3$/cm$^2$ to as low as about 4/cm$^2$ by increasing the molar ratio of H$_7$/CH$_4$ from about 1,466 to about 6,600 (FIG. 8). The growth of graphene is believed to be a competing process between the pyrolysis of hydrocarbons and the etching effect by hydrogen. The growth of the graphene domains is sustained by continuously feeding the active carbon species from catalytic pyrolysis of hydrocarbons on the copper surface. At same time, the hydrogen gas can also decompose on the copper surface to form active atomic which can act as an etching agent to graphene. Without wishing to be bound by a particular theory, the higher H$_2$/CH$_4$ molar ratio suppresses the graphene nucleation due to the etching effect. Together, combining these different strategies, the nucleation density is greatly reduced down to about 4-nuclei/cm$^2$, thereby achieving single crystalline graphene domains with a largest reported area over about 16 mm$^2$.

Figure 9:
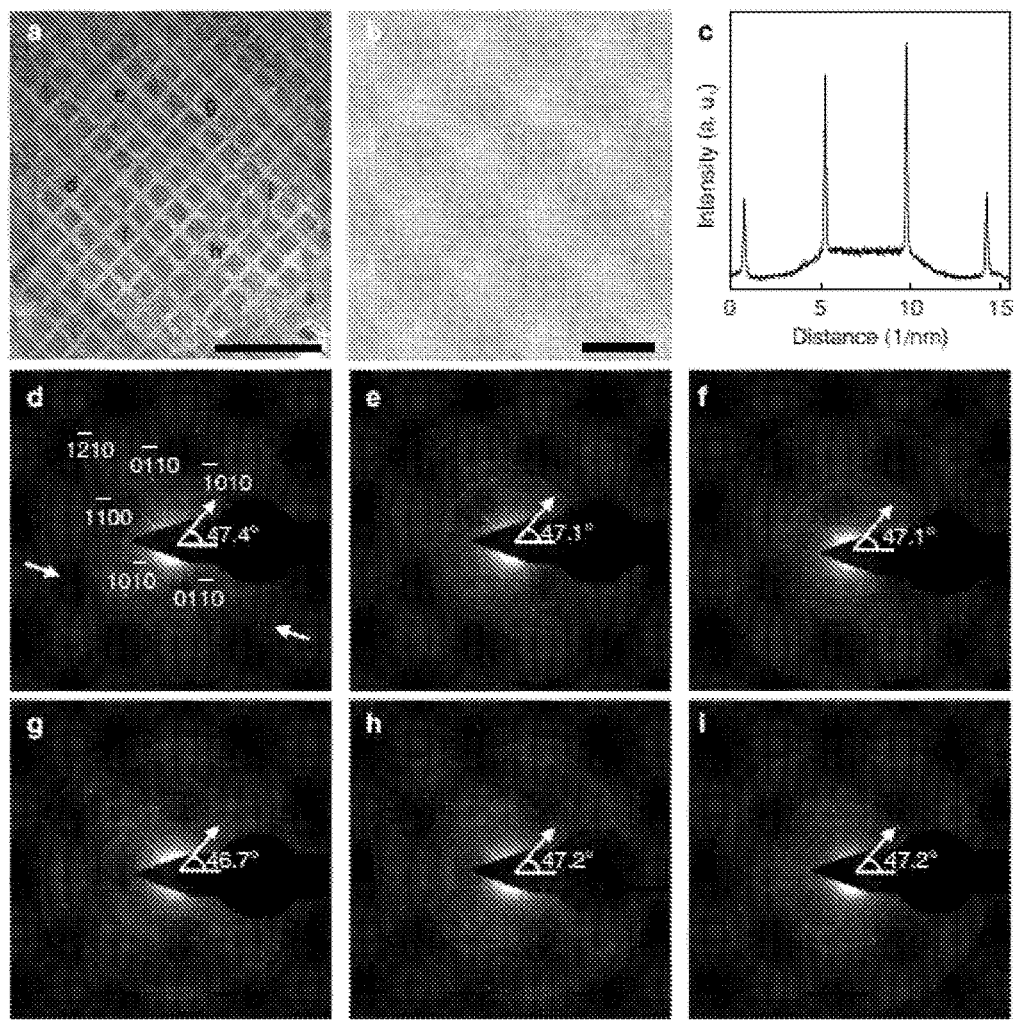
FIG. 9: Electron microscopic characterization of a large graphene single crystal. (a) SEM image of an about 1.5 mm sized monolayer graphene domain on a transmission electron microscopy (TEM) grid with an array of 100×100 μm windows. The scale bar is 0.5 mm. (b) A bright-field TEM image of the graphene on the TEM grid taken from the approximate location pointed by an arrow in panel a. The scale bar is 200 nm. (c) Profile plots of the diffraction peak intensities along the white arrows in d. (d-i) Selected area electron diffraction (SAED) patterns taken from different holes of the TEM grid, labelled according to the locations indicated in panel a. The white angle lines highlight the graphene lattice orientation (the angle between the [$\bar{1}$010] direction and the x-axis) at different locations. The relative angle of graphene lattice extracted from the SAED patterns shows less than about 1.2° rotation throughout the entire domain.
Figure 10:
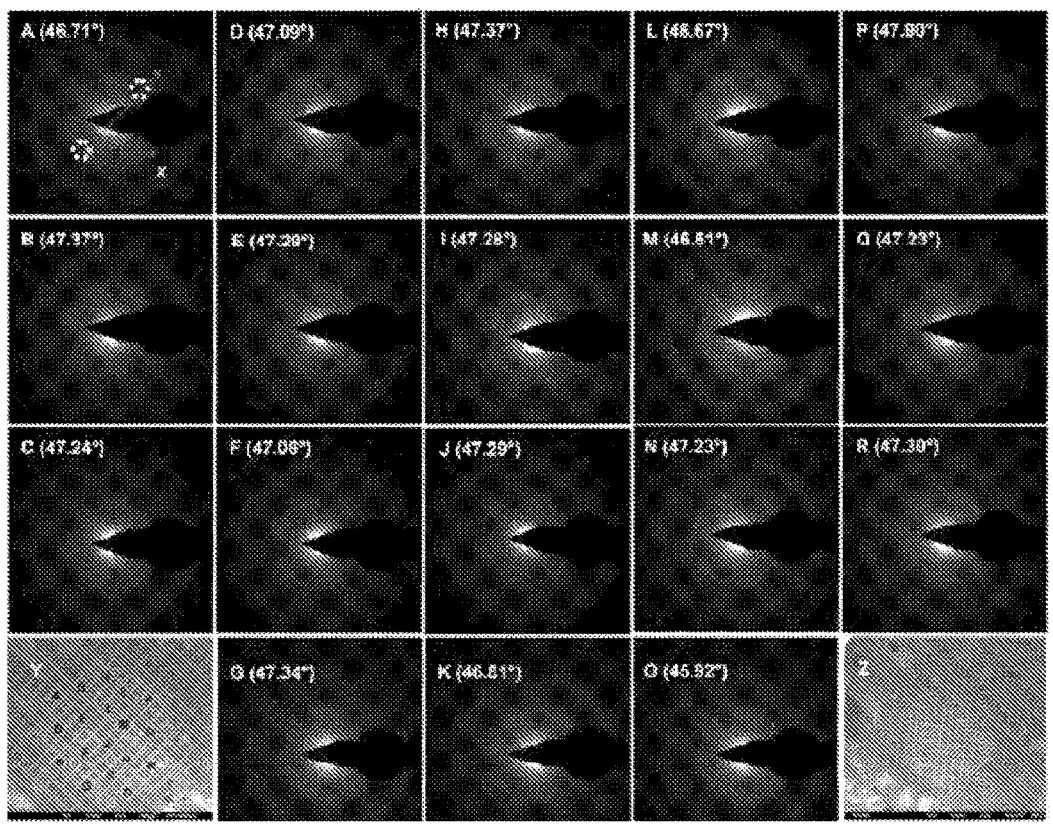
FIG. 10: TEM and electron diffraction characterizations of graphene monodomain. (Y) and (Z) are SEM images of an about 1.5 mm sized monolayer graphene on a TEM grid with 100×100 μm windows at two different magnifications. (A-R) SAED patterns taken from different holes of the TEM grid, labeled (top left in each panel) according to the locations indicated in (Y). Measured angles (in degrees) of graphene lattice are shown in each panel, according to the axis defined in the first image (A).

Transmission electron microscopy (TEM) and electron diffraction (ED) studies were conducted to confirm the single crystalline nature of the large hexagonal graphene domains. To this end, the as-grown graphene films were transferred onto an amorphous carbon covered TEM grid (with 100×100 μm sized square holes). An SEM image of the graphene on TEM grid shows an about 1.5 mm graphene domain retains its structural integrity with the hexagonal shape well preserved (FIG. 9a). FIG. 9b shows a bright field TEM image of the graphene film at the edge region (highlighted by a red arrow in FIG. 9a). The graphene film is clean, uniform, and the edge is straight. In order to confirm the crystallinity of the graphene domain, selective area electron diffraction (SAED) is conducted on the graphene domain at 18 selected openings (FIG. 10). FIGS. 9d-9i show six typical SAED patterns, with the zone axis of {0001}, taken at the holes which are labelled in FIG. 9a. The line profiles of diffraction patterns show a diffraction intensity ratio of outer {1120} peak over inner {1100} peak close to about 0.5, demonstrating the monolayer nature of the graphene domain (FIG. 9c). The diffraction patterns obtained from 18 individual window openings are analyzed, and no signs of noticeable graphene boundaries or any intrinsic large scale defects or disorder were observed. The relative angle of graphene lattice extracted from the SAED patterns shows less than about 1.2° rotation of the graphene lattice direction throughout the entire domain (FIG. 10). These results unambiguously confirm that the graphene domain is a single crystalline monolayer across its entire area.

Figure 11:
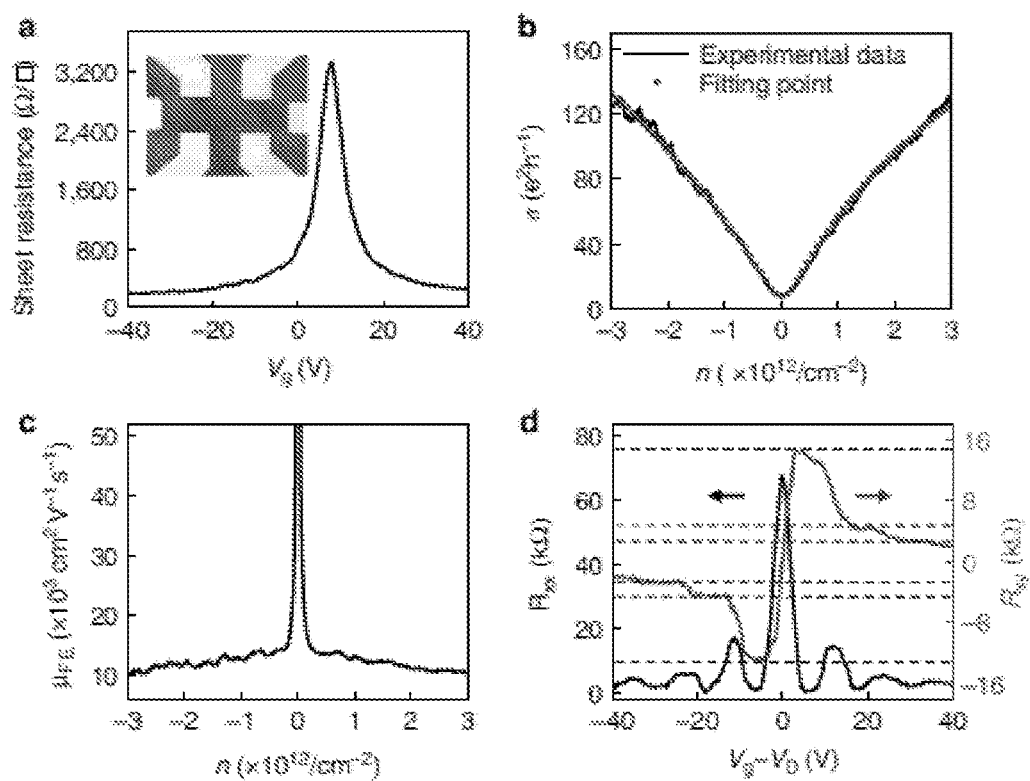
FIG. 11: Electronic properties of graphene single crystals. (a) Resistivity of graphene depending on a back gate voltage at room temperature. The upper inset is an optical microscopy image of a graphene Hall bar field-effect transistor (FET) on a $SiO_2$/Si substrate. (b) Conductivity of graphene as a function of carrier density at room temperature. The line of the experimental data is fitted by a Boltzmann model with dots. (c) The density-dependent field-effect mobility of graphene plotted as a function of carrier density at room temperature. (d) Electrical properties of monolayer graphene Hall bar devices showing the half-integer quantum Hall effect, the longitudinal ($R_{xx}$) and transverse ($R_{xy}$) magnetoresistances is measured at 1.8 K under a magnetic field B=9 T. The half-integer plateaus corresponding to v=2, 6, and 10 are indicated by horizontal dash lines.

To evaluate the electronic quality of the ultra-large graphene single crystals, a monodomain graphene was transferred onto an about 300 nm $SiO_2$/substrate to fabricate Hall bar devices without any domain boundaries tier detailed electronic property characterizations. FIG. 11a displays a plot of resistivity of a graphene device depending on the back gate voltage at room temperature. FIG. 11b plots the conductivity as a function of carrier density n (defined by $n=C_g(V_g-V_D)/e$, $C_g=11.5$ nF/cm$^2$), which shows the conductivity ($\sigma$) is nearly linear with carrier density, with substantially identical slopes for both electrons and holes. FIG. 11c shows the carrier-density-dependent field-effect mobility ($\mu_{FE}=\sigma/ne$), ranging from about 11,000 cm$^{-2}$V$^{-1}$s$^{-1}$ (at high carrier density of about $2\times10^{12}$/cm$^2$) to greater than about 14,000 cm$^{-2}$V$^{-1}$s$^{-1}$ (at low carrier density of about $5\times10^{11}$/cm$^2$). The conductivity data can be fitted (dashed line in FIG. 11b) with a standard self consistent diffusive transport model, $\sigma^{-1}=(ne\mu_c+\sigma_0)^{-1}+\rho_s$, where $\mu_c$ is the density-independent carrier mobility corresponding to the long-range scattering, $\sigma_0$ is the residual conductivity at the Dirac Point, and the $\rho_s$ is the resistivity induced by the short-range scattering. The fitting gives a carrier density-independent carrier mobility $\mu_c=16,000$ cm$^2$V$^{-1}$s$^{-1}$, which is about 50% higher than other reported mobility and comparable to those of the best exfoliated graphene samples on silicon oxide substrate. This high carrier mobility achieved in the graphene devices demonstrates the excellent electronic quality of the graphene single crystals. Additionally, the half-integer quantum Hall effect is observed in the Hall bar device (FIG. 11d), further confirming that the electronic quality of the CVD graphene materials is at least comparable to that of the exfoliated graphene on the $SiO_2$/Si substrate.

Figure 12:
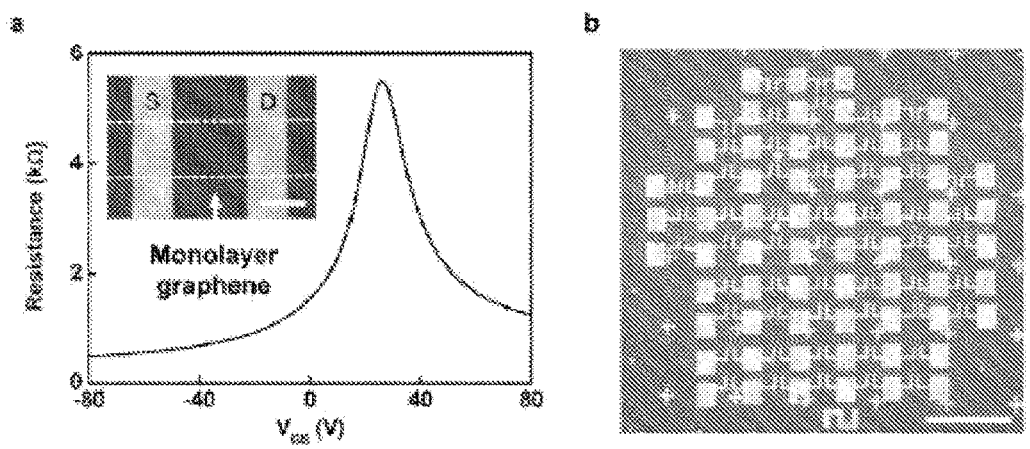
FIG. 12: Electrical characterization of monolayer graphene. (a) Transfer characteristics of a transistor fabricated on an about 1 mm sized graphene monolayer domain. The extracted electron and hole mobility of this device is about 6,400 $cm^2V^{-1}s^{-1}$ and about 8,100 $cm^2V^{-1}s^{-1}$, respectively. The inset shows an optical image of a graphene transistor. Scale bar is 5 μm. (b) The optical image of the 55 transistor array fabricated on the about 1 mm sized single crystalline graphene monolayer domain. Scale bar is 200 μm.
Figure 13:
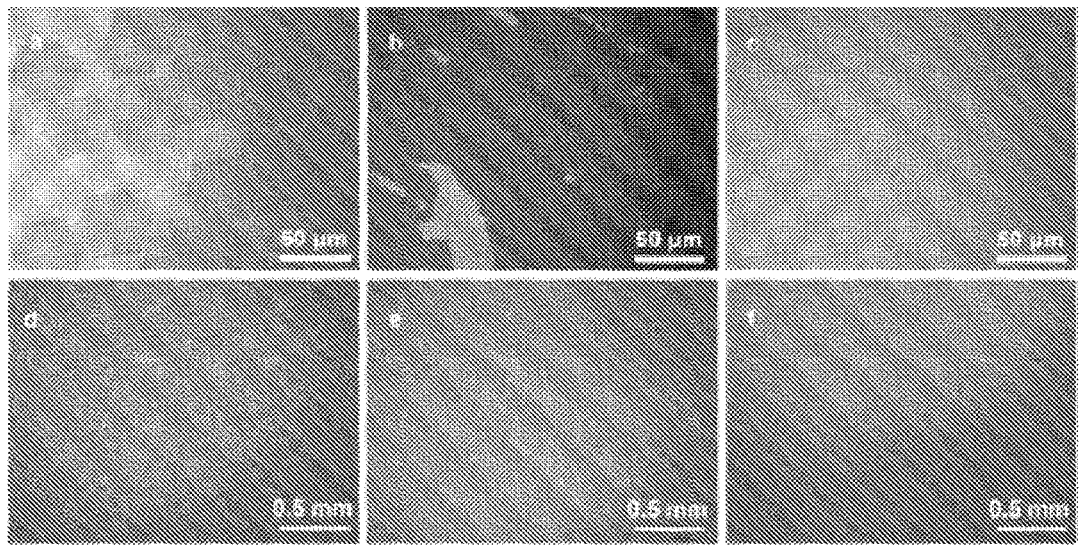
FIG. 13: Synthesis of continuous polydomains monolayer graphene. SEM images of the graphene synthesized at about 1,070° C. under $Ar/H_2$/diluted $CH_4$ (about 290/30/30 sccm) with the reactor pressure of about 100 mbar for different growth time: (a) and (d) for about 15 min; (b) and (e) for about 30 min; (c) and (f) for about 60 min. Continuous polydomains graphene (domains size of about 50 μm) is achieved after about 1 hour growth.
Figure 14:
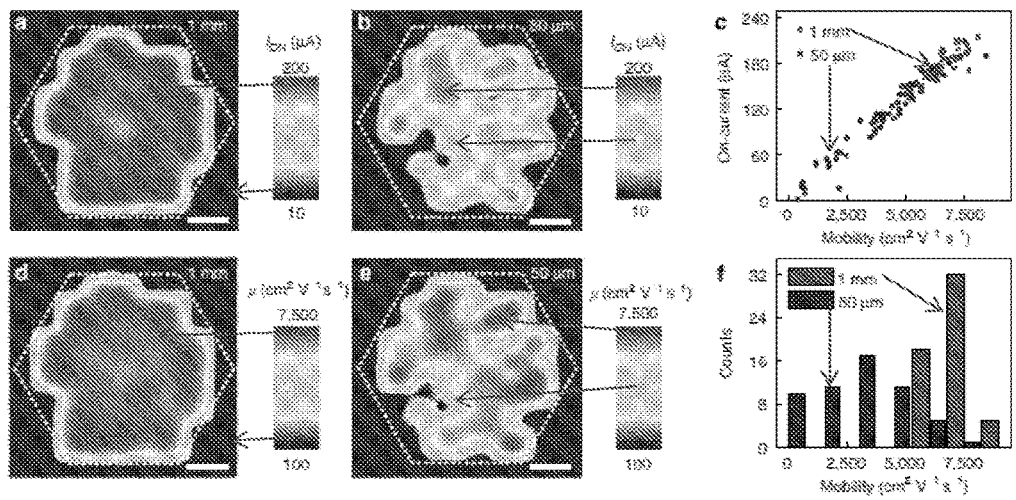
FIG. 14: The electronic uniformity of a single crystalline graphene compared with that of a polycrystalline one, (a) Two-dimensional contrast plot of the on-current of a 55-FET-device array made on an about 1-mm sized single crystalline graphene monodomain, and (b) on an about 1-mm area of polycrystalline graphene sheet (with individual domain size of about 50 μm). (c) On-currents and mobilities plot of the 55 FETs from the single crystalline graphene monodomain and the polycrystalline graphene sheet. (d) Two-dimensional contrast plot of the hole mobility of the 55-FET device array made on the single crystalline graphene monodomain, and (e) on the same area polycrystalline graphene sheet. (f) Histogram of the carrier mobility distribution of the graphene FETs made on the single crystalline domain and polycrystalline sheet. The scale bars are 200 μm in a, b, d, and e.

Domain boundaries are a factor responsible for device-to-device variation in CVD graphene devices. The growth of large domain single crystalline graphene eliminates or reduces the domain boundaries and can greatly improve device uniformity. To this end, a large number of graphene devices are fabricated on a single crystalline graphene domain. The electronic quality of a millimeter sized single domain was evaluated by measuring the back-gated field-effect transistors (FETs) produced on Si/SiO$_2$ substrates, using Ti/Au (50/50 nm) as source and drain electrodes (FIG. 12). Two parallel samples of 55 transistors are fabricated on an about 1 mm-sized single crystalline graphene domain and a same sized polycrystalline monolayer graphene sheet (with a domain size of about 50 μm, the detailed growth processes are described in the Methods section, see FIG. 13). The transistor transport characteristics were studied in a probe station under ambient conditions to obtain the on-currents and carrier mobilities of all devices, which were used to create spatial distribution maps of the on-current and mobilities. Of note, the devices fabricated from the single crystalline sample show about 100% yield with highly uniform distribution of the on-currents (FIG. 14a) and carrier mobilities (FIG. 14d) throughout the entire area. In contrast, the polycrystalline sample shows much larger variation in both the on-current (FIG. 14b) and carrier mobilities (FIG. 14e). Overall, the mean values of on-currents and mobilities of the FETs from the single crystalline sample are about 173.8 μA and about 6,391 cm$^2$V$^{-1}$s$^{-1}$ with standard deviations of about 22.3 μA and about 843 cm$^2$V$^{-1}$s$^{-1}$, respectively. In contrast, the mean values of the on-currents and mobilities of the FET arrays on the polycrystalline sample are about 98.7 μA and about 3,601 cm$^2$V$^{-1}$s$^{-1}$ with standard deviations of about 51.4 μA and about 1,941 cm$^2$V$^{-1}$ s$^{-1}$, respectively. The on-current and mobilities of graphene FETs fabricated on the small domain size polycrystalline samples show about 400% larger deviation (standard deviation/mean value) compared to that on the large domain single crystalline graphene. This large deviation can be largely attributed to domain boundaries scattering, which does not exist in the large domain single crystalline graphene.

It is noted that the highest mobility value achieved in the polycrystalline sample (about 8,035 cm$^2$V$^{-1}$s$^{-1}$) is comparable to that in the single crystalline sample (about 8,117 cm$^2$V$^{-1}$s$^{-1}$); while the lowest mobility observed in the polycrystalline sample (about 0 cm$^2$V$^{-1}$s$^{-1}$) is much lower than that of the single crystalline domain (about 4,495 cm$^2$V$^{-1}$s$^{-1}$). This is understandable since the domain size of the polycrystalline sample (about 50 μm) is larger than the device size (about 10 μm). In this case, for the polycrystalline samples, a certain percentage of the devices are expected to have a single crystalline channel without domain boundaries and to exhibit similar device characteristics to that of the large domain single crystalline sample; while the other devices with domain boundaries in the channel exhibit much poorer device performance. It is also noted that some extrinsic effects such as the transfer process, surface absorbed species or substrate-graphene interaction, rather than the intrinsic quality of the graphene, could also contribute to the variation in mobility distribution or limit the highest mobility achievable in the devices without domain boundaries.

Figure 15:
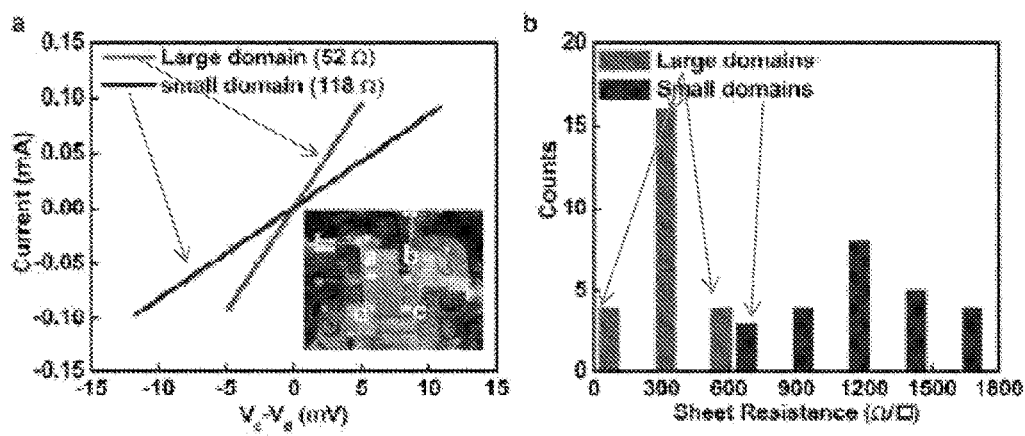
FIG. 15: The sheet resistances of graphene samples (about 1 cm about 1 cm) were measured with a four probe station. (a) The current versus voltage plot of a monolayer graphene sample with large (about 2 mm) and small domains (about 50 μm), (b) Sheet resistance of 48 measured samples. The large domain samples show overall lower sheet resistance than that of the smaller samples.

To evaluate the overall quality of a continuous graphene film made of large domain graphene, the sheet resistances of continuous graphene films formed by large domains (domain size of about 2 mm) and small domains (domain size of about 50 μm) are compared. In order to make a more fair comparison between large domain versus small domain devices, sheet resistance measurement was conducted on a multi-domain large area sample (about 1 cm×about 1 cm) so that the transport in both samples goes across multiple domain boundaries. Here both large (about 2 mm domain size) and small (about 50 μm of lateral domain size) domain samples are polydomains, where a large domain sample has about 20-30 domains and a small domain sample has about 40,000 domains. The studies show that the overall sheet resistance of the large domain sample is about one quarter of that of the smaller domain samples (FIG. 15), which can be largely attributed to the greatly reduced domain boundary scattering in a large domain graphene film.

Using the large single crystalline monolayer graphene domains as templates, a second layer can be grown without crossing the boundary of the first layer to achieve a large domain bilayer graphene with consistent stacking order (e.g., AB stacking order, FIG. 16a) throughout the entire area. In contrast, for bilayer graphene obtained from small polydomain graphene, the stacking order can vary when the second layer goes across the grain boundary of the first layer.

Figure 16:
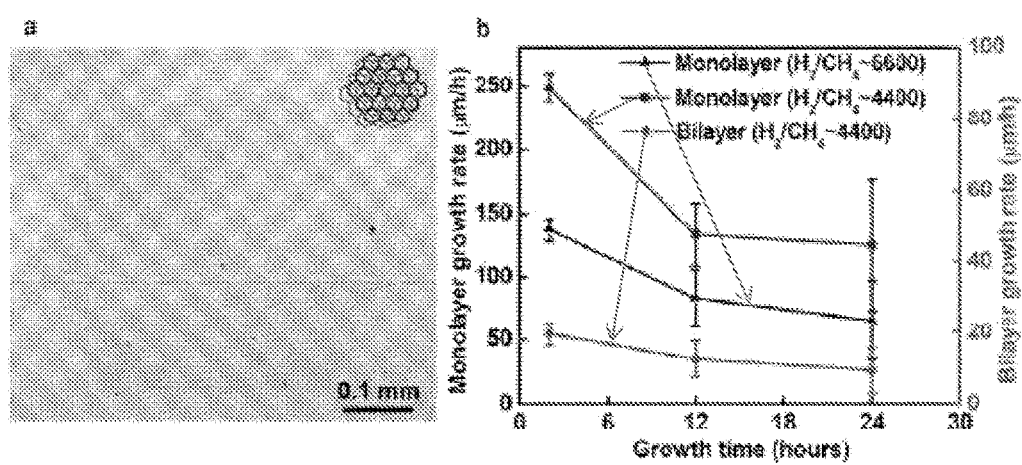
FIG. 16: The growth of bilayer domains, (a) Optical microscope image of a bilayer graphene grown at about 1,070° C. under the reactor pressure of about 5 mbar with the $H_2/CH_4$ molar ratio of about 4,400 ($Ar/H_2/CH_4$ flow rates: about 50/200/100 sccm) with growth time of about 2 h. An insert is the schematic diagram illustrating the AB-stacking order. The substantially zero-rotation between the first and second layer suggests an AB-stacking ordering in this bilayer graphene. (b) Average graphene growth rate of monolayer and bilayer graphene under two different growth conditions.

To this end, systematic time dependent studies were conducted to investigate the growth kinetics of monolayer and bilayer graphene. In general, when the $H_2/CH_4$ ratio is sufficient high (e.g. >about 6,600), the growth of bilayer graphene can be largely neglected. The growth of bilayer graphene became noticeable with reducing $H_2/CH_4$ ratio (e.g., about 4400). Even under this condition, the growth of bilayer graphene is still about one order of magnitude slower than that of monolayer graphene (FIG. 16b). This different growth rate for the single and bilayer graphene can be attributed to a diffusion limited growth. Specifically, the active carbon species are generated by catalytically cracking $CH_4$ on the exposed Cu surface. For such carbon species to contribute to the growth of the second layer graphene, they have to diffuse across the edge of the first layer. In this process, most of such carbon species may be captured by the first layer and contribute to the growth of the first layer, and a small percentage of the carbon species may be able to go across the edge of the first layer to reach the second layer. The reduction of $H_2/CH_4$ ratio can increase the supersaturation of the carbon precursors, to allow the active carbon species to have a greater chance to cross the edge of first layer and contribute to growth of the second layer graphene (FIG. 16). On the other hand, it may not be practical to infinitely reduce $H_2/CH_4$ ratio and increase the supersaturation of the carbon precursors, which can lead to a rather fast growth of the first layer and a complete passivation of the entire Cu surface.

Figure 17:
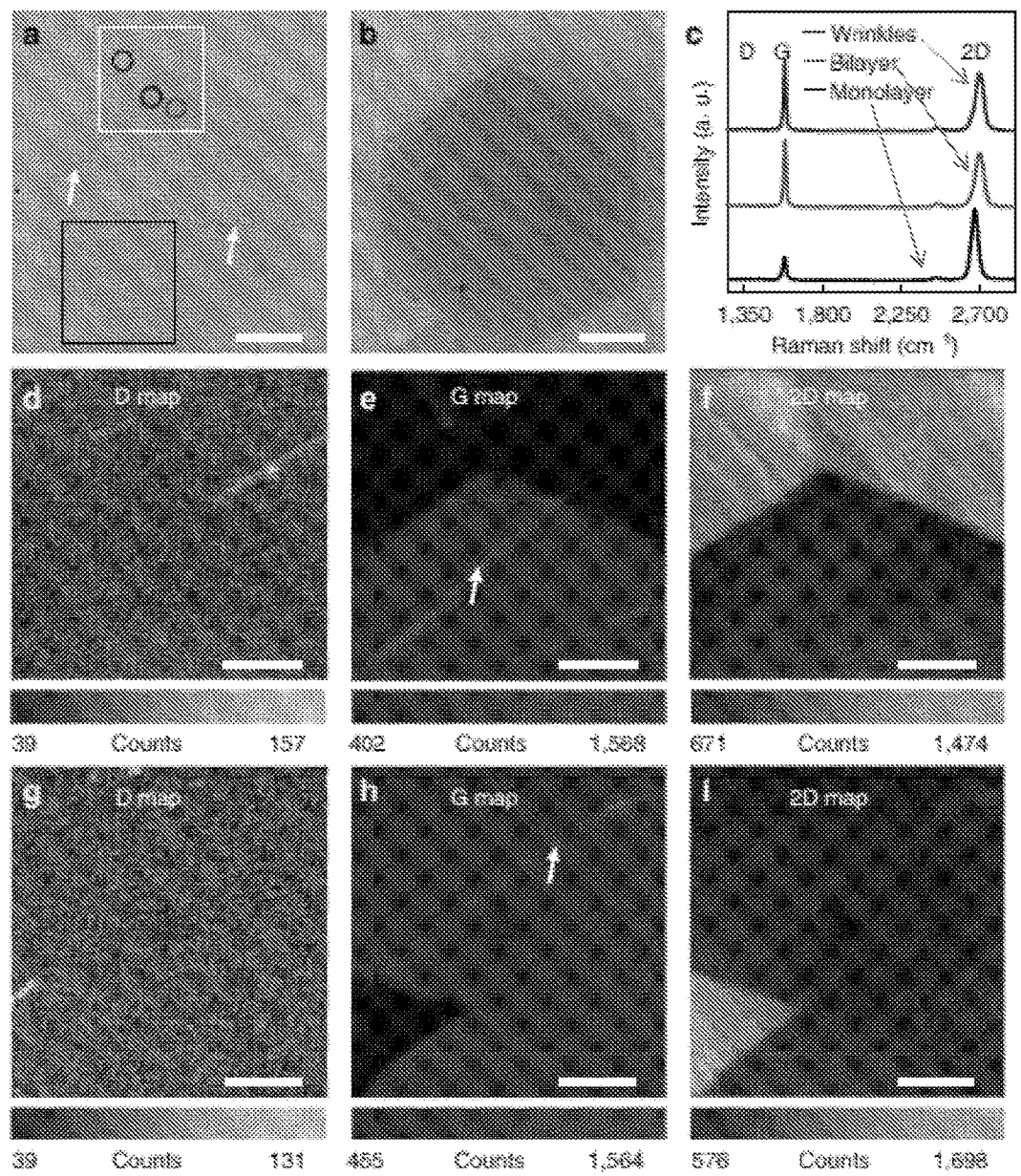
FIG. 17: Raman characterization of a large domain AB-stacked bilayer graphene. (a) Optical microscope image of a graphene domain transferred onto a $SiO_2$/Si substrate (about 300-nm-thick oxide layer) showing bilayer region (higher contrast hexagon at the center of the image) and a few wrinkles formed during the transfer process (highlighted by white arrows). (b) SEM image of the same regions as in (a). (c) Raman spectra taken from the marked spots with corresponding circles in panel a. A.U., arbitrary units. (d-f) Raman maps of the D (about 1,350 $cm^{-1}$), G (about 1,580 $cm^{-1}$), and 2D (about 2,680 $cm^{-1}$) bands, respectively, obtained from the upper region of the bilayer graphene marked with white rectangle in a. (g-i) Raman maps of the D (about 1,350 $cm^{-1}$), G (about 1,580 $cm^{-1}$), and 2D (about 2,680 $cm^{-1}$) bands, respectively, obtained from the lower region of the bilayer graphene marked with black rectangle in a. The white arrows in e and h highlight the wrinkles. The scale bars are 50 μm in a and b, 20 μm in d, e, f, g, h and i.
Figure 18:
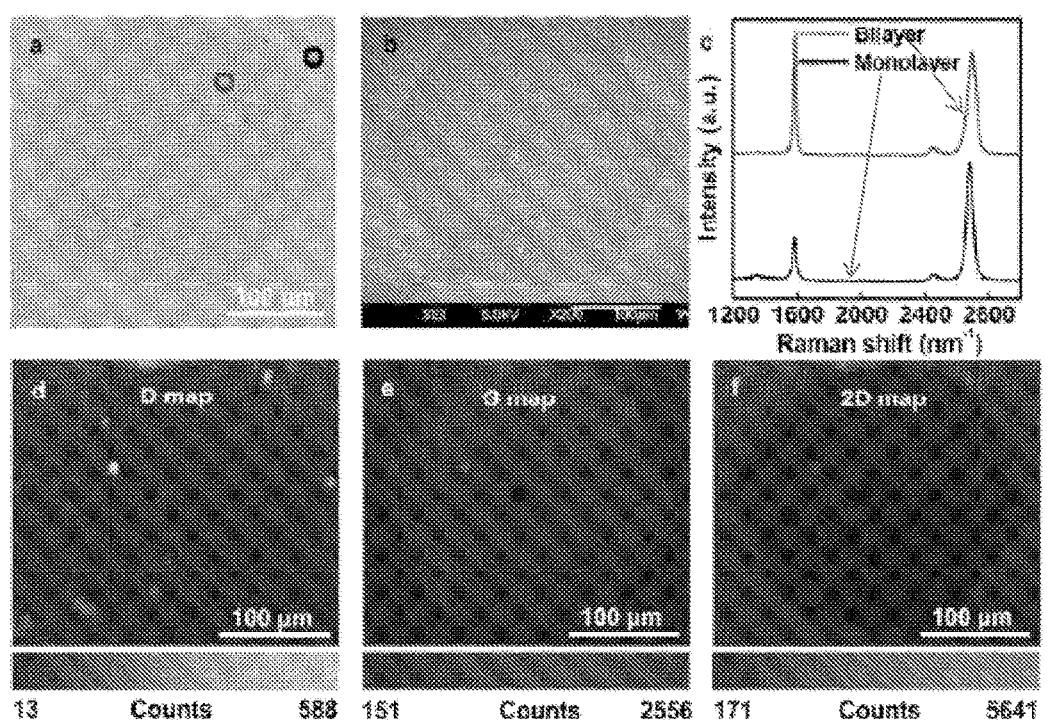
FIG. 18: Raman mapping characterizations of AB-stacked bilayer graphene. (a) Optical microscope image of graphene transferred onto a $SiO_2$/Si (about 300-nm-thick oxide layer) substrate showing the bilayer regions. (b) SEM image of the same regions as in (a). (c) Raman spectra taken from the marked spots with corresponding circles in panel a. (d to f) Raman maps of the D (about 1,350 $cm^{-1}$), G (about 1,580 $cm^{-1}$), and 2D (about 2,680 $cm^{-1}$) bands, respectively. The spectra of monolayer graphene (right circle) and AB-stacked bilayer (left circle) show the representative features of single and bilayer graphene. The AB-stacked bilayer sample is grown at about 1,070° C. under the reactor pressure of about 5 mbar with the $H_2/CH_4$ molar ratio of about 4,400 ($Ar/H_2/CH_4$ flow rates: about 50/200/100 sccm) for a duration of about 24 hours. Here a lower molar ratio of $H_2/CH_4$ is used to efficiently activate the second layer growth, and a higher reactor pressure is used to enhance the area coverage of AB-stacked bilayer graphene.

The ultra-large single crystals of monolayer graphene provide a desirable template for the growth of large sized domains of bilayer graphene. For example, bilayer graphene domains can be obtained with the lateral size up to about 300 µm without crossing any domain boundary on the first layer (FIG. 18). This is believed to be the largest reported AB-stacked bilayer domain, with the bilayer area nearly ten times larger than the best reported value in other studies. A 200 µm bilayer graphene is evaluated by both contrast under the optical microscope and more clearly the contrast shown in the SEM image (FIGS. 17a and 17b).

Figure 19:
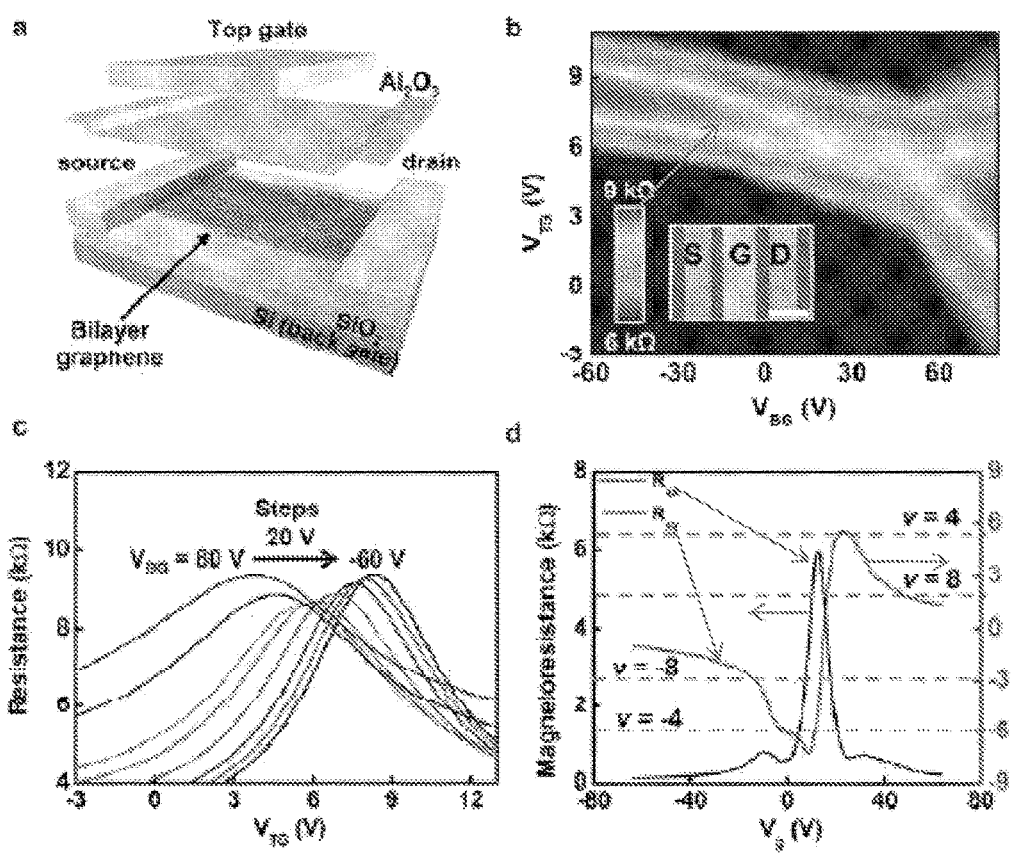
FIG. 19: Electrical characteristics of AB-stacked bilayer graphene monodomain. (a) Three-dimensional illustration of a dual-gated bilayer graphene device. (b) Two-dimensional contrast plot of bilayer graphene resistance versus top gate voltage ($V_{TG}$) and back gate voltage ($V_{BG}$) at room temperature. Electrical measurement was performed at room temperature in the vacuum. The different contrasts represent 9 kΩ and 6 kΩ resistances, respectively. The data show that resistance of charge neutral point (Dirac point) reaches a maximum at the upper left and lower right corners of the graph, where the average displacement fields from top and bottom gates are the greatest. The insert is an optical image of a bilayer graphene FET with a channel length and width of about 10 µm and about 7 µm, respectively, it has a local top gate and a global silicon back gate with $Al_2O_3$ (about 30 nm) and $SiO_2$ (about 300 nm) as the respective gate dielectrics. Scale bar is 6 µm. (c) Resistance versus $V_{TG}$ at different value of fixed $V_{BG}$. The series of curves are taken from $V_{BG}$ of 80 to −60 V, with 20 V increment. The off-resistance increases in both directions of back gate voltage. (d) Longitudinal ($R_{xx}$) and Hall resistivity ($R_{xy}$) versus gate voltage, measured at B=9 T and T=1.8 K for AB-stacked bilayer graphene. The data shows quantum Hall effects, marked by vanishing $R_{xx}$ and quantized $R_{xy}$ at filling factors ν=±4, ±8.

Raman mapping experiment can be further used to identify the stacking order of the bilayer graphene. The Raman spectra of graphene show typical features of G (about 1,580 cm$^{-1}$) and 2D (about 2,680 cm$^{-1}$) bands. For single layer graphene, the D bands (about 1,350 cm$^{-1}$) is not visible, indicating the high quality of the monolayer graphene films with few defects. Furthermore, the Raman spectrum shows 2D/G intensity ratio of about 2.65 and the narrow symmetric 2D band (about 2,684 cm$^{-1}$) with the full width at half-maximum (FWHM) of about 33 cm$^{-1}$ (FIG. 17c), consistent with the expected features of monolayer graphene. The darker hexagonal region in the center of the optical image corresponds to the AB-stacked bilayer graphene (FIG. 17a). A typical spectrum shows a wider and asymmetric 2D band (FWHM of about 58 cm$^{-1}$) with the 2D/G intensity ratio of about 0.8, which is quite similar to that of the exfoliated bilayer graphene samples with AB stacking order. Two sets of Raman maps were taken on both the upper (highlighted by white rectangles) and the lower region (highlighted by dark rectangles) of the AB-stacked bilayer domain. The D map of upper region of the domain is rather uniform and at the background level (FIG. 17d), except for the area where wrinkles are present. No clear contrast is observed between the regions of monolayer and AB-stacked bilayer D map, which indicates a similar good quality of the AB-stacked bilayer graphene to that of the monolayer. In the G map, the peak intensity of the AB-stacked bilayer graphene is about 2.2 times higher than that of the monolayer region. In the 2D map, the peak intensity of the AB-stacked bilayer is about 71% compared to that of the monolayer region. These are clear signatures differentiating the AB-stacked bilayer from the monolayer graphene in the Raman maps. The wrinkles show a better contrast in the G map due to the large intensity variations according to the number of the layers. The D, G and 2D maps of the lower region of the bilayer graphene domain are similar to that of the upper region (FIGS. 17g, h and i). Within the two mapping regions (90×90 µm for each), the uniformity of the peak heights observed in the monolayer and AB-stacked bilayer regions indicate high quality and good uniformity of the monolayer and bilayer graphene films. The Raman mapping confirms that a largest domain of AB-stacked bilayer graphene up to about 300 µm can be achieved with the approach (FIG. 18). Electrical transport studies of the dual-gated AB stacked bilayer graphene shows expected electrical characteristics, with the maximum Dirac resistance value increasing with $V_{BG}$ in both the positive and negative directions (FIG. 19).

In summary, this example demonstrates that a nucleation density of graphene domains in a CVD process can be dramatically reduced from about $10^6$-nuclei/cm$^2$ to about 4-nuclei/cm$^2$, using an integrated strategy of low reactor pressure, high hydrogen/methane molar ratio, and pre-annealing of a copper foil in a pure argon environment (or other suitable non-reducing gas, such other suitable inert gas, oxidizing gas, or a mixture of inert and oxidizing gases), thereby providing a way to prepare ultra-large single crystalline domains of monolayer and bilayer graphene. The ultra-large single crystalline domain graphene can provide excellent device performance with highly uniform electrical characteristics. It can therefore pave an effective pathway to large scale integration of graphene devices with high yield and high reproducibility, which are the desirable for practical applications.

Methods

Graphene Growth.

Graphene was synthesized by copper-catalyzed low pressure chemical vapor deposition (LPCVD) using a gas mixture of Ar, $H_2$, and diluted $CH_4$ (500 ppm methane balanced in argon), where $CH_4$ gas was the carbon-containing precursor. First, about 25 µm thick copper foils (99.8%, Alfa Aesar, 13382) were washed by HCl/$H_2O$ (about 1:10), triple rinsed by isopropyl alcohol (IPA), and dried by $N_2$ blow. The dried copper foils were loaded into a custom-built CVD system in a horizontal tube furnace (Lindberg/Blue M) with 1-inch quartz tube. The system was pumped down to a vacuum of about 10 mTorr in about 30 min, and re-filled with about 300 sccm of pure Ar gas or Ar/$H_2$ mixture and heated to about 1,070° C. within about 25 min. Next the diluted methane and hydrogen were introduced into the CVD system for the graphene growth at about 1,070° C. with different $H_2/CH_4$ molar ratio (about 1320 to about 8800) under variable pressure of about 1 to about 1,000 mbar. The growth was terminated by quenching the quartz tube (cooling rate was about 200° C./min) in ambient environment.

Graphene Transfer.

The transfer of the graphene films onto 300 nm $SiO_2$ substrates was performed by the wet-etching of the copper substrates. The graphene was grown on both sides of the copper foils, and one side of the graphene/copper surface was spin-coated with poly(methyl methacrylate) (PMMA) (495 PMMA C2, MicroChem) and baked at about 120° C. for about 2 min. The other side of the sample was exposed to $O_2$ plasma for about 60 seconds to remove the graphene. After that, the Cu foils were etched away using copper etchant (Transene, CE-100), resulting in a free-standing PMMA/graphene film floating on the surface of the etchant bath. The PMMA/graphene film was washed with HCl/deionized (DI) $H_2O$ (about 1:10) and DI water for several times, and then transferred onto a silicon substrate with about 300 nm $SiO_2$. After dried in the air, the PMMA was dissolved by acetone, and the substrate was rinsed with isopropyl alcohol to yield a graphene film on the substrate.

Graphene Device Fabrication.

Single back-gated and dual-gated graphene FETs were fabricated on the monolayer and bilayer graphene on a silicon substrate with about 300 nm $SiO_2$. To this end, the as-grown graphene is first transferred onto the blank $Si/SiO_2$ substrate. Photolithography and $O_2$ plasma etching were used to pattern graphene films into about 7 µm wide strips. After that, e-beam lithography was employed to pattern contact electrodes with the channel lengths of about 10 µm. The source/drain electrodes (Ti/Au: about 50 nm/about 50 nm) were deposited using e-beam evaporation. The back gate voltage was applied by using a Si back gate with $SiO_2$ as the dielectric. For the dual-gated device, about 30 nm $Al_2O_3$ top dielectric layer was then deposited on the top of the device using e-beam evaporation, followed by the definition of top gate electrode (Ti/Au: about 50 nm/about 50 nm) using e-beam lithography.

Characterizations.

The morphology and structure of the graphene were characterized with optical microscopy (Olympus BX51, and Nikon), field emission scanning electron microscopy (FE-SEM, JSM-6701F), high-resolution transmission electron microscopy (HRTEM, FEI Titan STEM at 300 kV), Raman spectroscopy (Renishaw 1000, 514 nm laser wavelength, 50× objective), and Raman maps of the D (1,300 to 1,400 $cm^{-1}$), G (1,560 to 1,620 $cm^{-1}$), and 2D (2,660 to 2,700 $cm^{-1}$) bands (514 nm laser wavelength, the Raman map pixel size is 1 µm). Electrical transport properties of the samples were measured at room temperature in a Lakeshore probe station (Model PTT4) with a computer-controlled analog-to-digital converter (National instruments model 6030E).

As used herein, the singular terms "a," "an," and "the" include plural referents unless the context clearly dictates otherwise. Thus, for example, reference to an object can include multiple objects unless the context clearly dictates otherwise.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±5%, such as less than or equal to ±4%, less than or equal to ±3%, less than or equal to ±2%, less than or equal to ±1%, less than or equal to ±0.5%, less than or equal to ±0.1%, or less than or equal to ±0.05%.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, operation or operations, to the objective, spirit and scope of the invention. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations is not a limitation of the invention.

What is claimed is:

1. A process of growing graphene, comprising:
providing a metal substrate;
annealing the metal substrate up to a growth temperature for an annealing time period and in the presence of a non-reducing gas; and
introducing a gas mixture to grow graphene over the metal substrate, wherein the gas mixture includes a first gas that is hydrogen, and a second gas that is a carbon-containing precursor, a molar ratio of the first gas and the second gas is at least 100, and introducing the gas mixture is carried out at a pressure up to 100 mbar,
wherein the graphene is a single crystalline, monolayer graphene domain having a lateral size of at least 2.4 mm.

2. The process of claim 1, wherein the metal substrate is a copper substrate.

3. The process of claim 1, wherein the growth temperature is in the range of 900° C. to 1,200° C.

4. The process of claim 1, wherein the annealing time period is less than 1 hour.

5. The process of claim 1, wherein the non-reducing gas includes argon.

6. The process of claim 1, wherein annealing the metal substrate is carried out in the absence of the first gas and the second gas.

7. The process of claim 1, wherein the second gas is methane.

8. The process of claim 1, wherein the molar ratio of the first gas and the second gas is at least 500.

9. The process of claim 1, wherein the molar ratio of the first gas and the second gas is at least 1,000.

10. The process of claim 1, wherein introducing the gas mixture is carried out at the pressure up to 10 mbar.

11. The process of claim 1, wherein introducing the gas mixture is carried out at the pressure up to 5 mbar.

12. The process of claim 1, wherein introducing the gas mixture is carried out subsequent to annealing the metal substrate.

13. The process of claim 1, wherein the graphene is a first graphene layer, and further comprising growing a second graphene layer over the first graphene layer.

14. The process of claim 1, wherein the non-reducing gas constitutes at least 95% by mole of all gases to which the metal substrate is exposed during annealing.

15. The process of claim 1, wherein the non-reducing gas constitutes at least 99% by mole of all gases to which the metal substrate is exposed during annealing.

16. The process of claim 1, wherein annealing the metal substrate is carried out in the absence of hydrogen.

17. The process of claim 1, wherein the lateral size of the single crystalline, monolayer graphene domain is at least 3 mm.

* * * * *